United States Patent [19]
Enomoto

[11] Patent Number: 5,841,162
[45] Date of Patent: Nov. 24, 1998

[54] NON-VOLATILE SEMICONDUCTOR MEMORY WITH FLOATING GATE AND CONTROL GATE AND FABRICATION PROCESS THEREFOR

[75] Inventor: Shuichi Enomoto, Tokyo, Japan

[73] Assignee: NEC Corporation, Japan

[21] Appl. No.: 822,906

[22] Filed: Mar. 24, 1997

[51] Int. Cl.⁶ .................. H01L 29/788; H01L 29/792
[52] U.S. Cl. .................. 257/315; 257/324; 257/314; 257/323; 257/321
[58] Field of Search ................ 257/314–325, 257/390; 438/257–264; 483/250–261

[56] References Cited

U.S. PATENT DOCUMENTS

| | | | |
|---|---|---|---|
| 3,984,822 | 10/1976 | Simko et al. | 340/173 R |
| 4,435,790 | 3/1984 | Tickle et al. | 257/315 |
| 5,172,200 | 12/1992 | Muragishi et al. | 257/315 |
| 5,545,906 | 8/1996 | Ogura et al. | 257/315 |
| 5,691,937 | 11/1997 | Ohta | 257/316 |

*Primary Examiner*—Tom Thomas
*Assistant Examiner*—Cuong Quang Nguyen
*Attorney, Agent, or Firm*—Hayes, Soloway, Hennessey, Grossman & Hage, P.C.

[57] ABSTRACT

An oxide layer is formed with covering the surface of floating gates and the surface of a substrate. Control gates are formed on the oxide layer only at the portion aligning to the upper surface and at least a part of the side surface of the floating gate. By this, up to the portion in parallel to the substrate from the side surface portion of the floating gate, the control gate is not extended. Even when an interval between adjacent memory cells is reduced, opening dimension of the contact hole formed between the memory cells can be made greater. Contact resistance can be reduced. Also, the size of the memory cell can be made smaller to permit increasing of package density.

10 Claims, 7 Drawing Sheets

NON-VOLATILE SEMICONDUCTOR MEMORY WITH FLOATING GATE AND CONTROL GATE AND FABRICATION PROCESS THEREFOR

BACKGROUND OF THE INVENTION

1. Field of the Invention

The present invention relates to a non-volatile semiconductor memory device which can be electrically written and erased data, and a fabrication process therefor. More specifically, the invention relates to a non-volatile semiconductor memory with a floating gate and a control gate for preventing occurrence of fluctuation of characteristics of respective memory cells, and a fabrication process therefor.

2. Description of the Prior Art

Figure 1A:
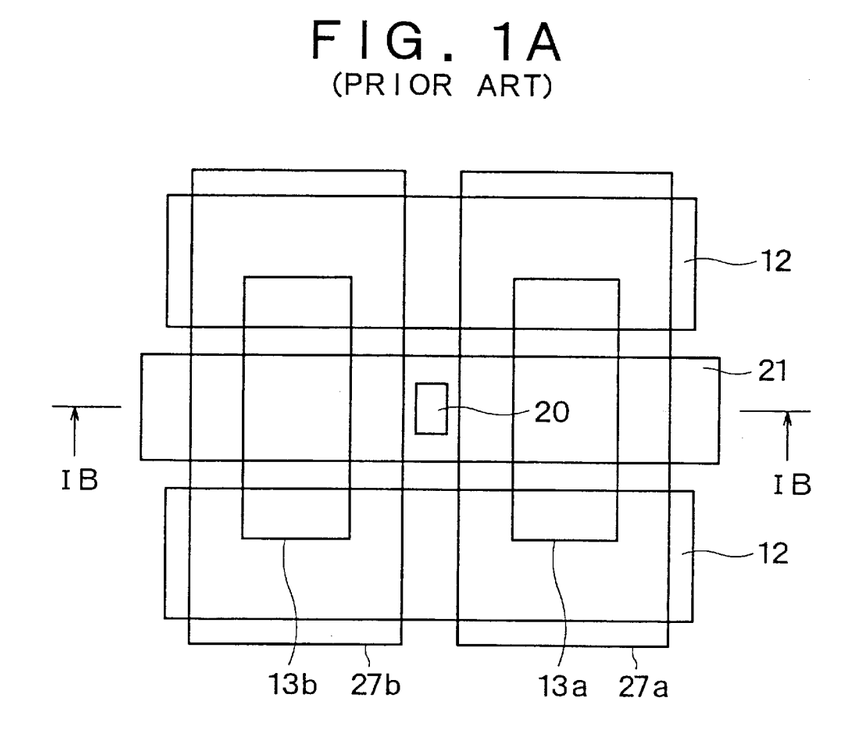
FIG. 1A is a plan view showing a pattern in fabrication of a non-volatile,semiconductor memory device of the first prior art.
Figure 1B:
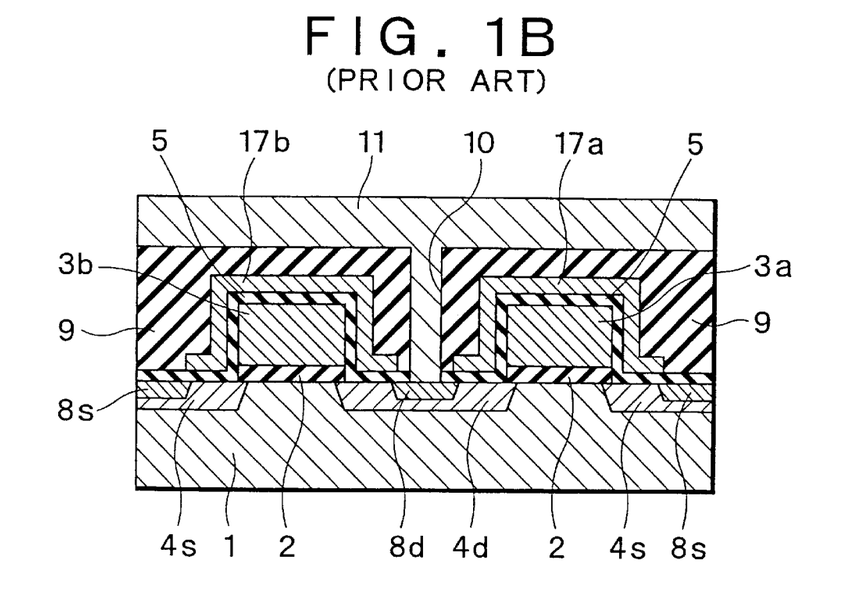
FIG. 1B is a section taken along line IB—IB of FIG. 1A.

Conventionally, a memory device having a floating gate and a control gate has been proposed as a memory device which can be electrically written and erased data (U. S. Pat. No. 3,984,822). This will be hereinafter referred to as first prior art. FIG. 1A is a plan view showing a pattern in fabrication of a non-volatile semiconductor memory in the first prior art, and FIG. 1B is a section taken along line IB—IB of FIG. 1A. Tunnel gate oxide layers 2 are selectively formed at two positions on the surface of a silicon substrate 1. Floating gates 3a and 3b are formed on the surface of the gate oxide layers 2. A first drain region 4d and a first source region 4s of n-type low concentration diffusion layers are formed in a region extending over adjacent gate oxide layers 2 at the surface of the silicon substrate. A second drain region 8d and a second source region 8s of n-type high concentration diffusion layers are formed at the surface of the center portion of respective of the first drain region 4d and the first source region 4s.

An insulation layers 5 are formed on the surfaces of the floating gates 3a and 3b. Control gates 17a and 17b are provided via the insulation layer. The control gates 17a and 17b cover the side surface from the above the floating gates 3a and 3b. The tip ends of the control gates 17a and 17b extend above the silicon substrate 1. By these floating gates 3a and 3b and corresponding control gates 17a and 17b, memory cells are constructed.

An interlayer insulation layer 9 of BPSG layer is formed on the surfaces of the control gates 17a and 17b. The interlayer insulation layer 9 is formed with a contact hole 10 in a region contacting with the second drain region 8d. Bit line 11 is formed over the entire region covering the surface of the interlayer insulation layer 9 with burying the contact hole 10. By this, the bit line 11 and the second drain region 8d are connected via the contact hole 10. The second source region 8s is connected to a source line (not shown).

Fabrication process of the non-volatile semiconductor memory will be described hereinafter. At first, a first mask 12 having a predetermined pattern is selectively formed on the silicon substrate 1. Using the first mask 12, an device region (not shown) is defined at the surface of the silicon substrate 1. Then, an oxide layer and a polycrystalline silicon layer are formed on the surface of the device region. Second masks 13a and 13b having predetermined patterns are formed over the polycrystalline silicon layer. Using the second masks 13a and 13b, the polycrystalline silicon layer and the oxide layer are etched sequentially to form the floating gate 3a and 3b and a tunnel gate oxide layer 2.

Subsequently, by thermal diffusion or ion implantation, the first drain region 4d and the first source region 4s are formed at the surface of the silicon substrate 1 in the region extending over the tunnel gate oxide layer 2. Thereafter, over the entire surface, the insulation layer and the polycrystalline silicon layer to be the control gate is formed. Third masks 27a and 27b of patterns shown in FIG. 1A are formed on the polycrystalline silicon layer. Then, using the third masks 27a and 27b, the polycrystalline silicon layer is selectively etched by photolithographic method to form the control gates 17a and 17b.

Subsequently, the second drain regions 8d and the second source regions 8s are formed at the surface of the substrate 1 by performing ion implantation and so forth from upper side of the substrate 1. The BPSG layer is formed over the entire surface. A fourth mask 20 having a predetermined pattern is formed over the BPSG layer. Then, using the fourth mask 20, the contact hole 10 is formed in the BPSG layer to form the interlayer insulation layer 9. Also, a conductive layer is formed over the entire surface. A fifth mask 21 of the predetermined pattern is formed on the conductive layer. Using the fifth mask 21, the conductive layer is etched to form the bit line 11.

In the non-volatile semiconductor memory device constructed as set forth above, a voltage to be applied to the control gates 17a and 17b is controlled to inject a charge into the floating gates 3a and 3b for varying conductive state of the transistor. With varying the state, the memory device stores data of 0 or 1.

In the fabrication process of the memory device in the first prior art as set forth, when the third masks 27a and 27b are formed for the control gates 17a and 17b, the third masks 27a and 27b have to be positioned in alignment with the floating gates 3a and 3b. Accordingly, it becomes necessary to provide a margin in consideration of mis-alignment in the adjacent direction (direction along line IB—IB) of the memory cells.

For example, when the alignment precision in this direction is ±0.2 µm, the third masks 27a and 27b has to be preliminarily formed to be greater respectively by 0.2 µm with respect to the positions of both side edges of the floating gate 3a and 3b. Also, for this margin, the opening dimension of the contact hole 10 has to be preliminarily designed to be smaller. As a result, contact resistance between the bit line 11 and the second drain region 8d is increased. On the other hand, when it is attempted to certainly provide satisfactory open area for the contact hole 10, it becomes inherent to increase interval between the floating gates 3a and 3b to cause increasing of size of respective memory cell.

Figure 2A:
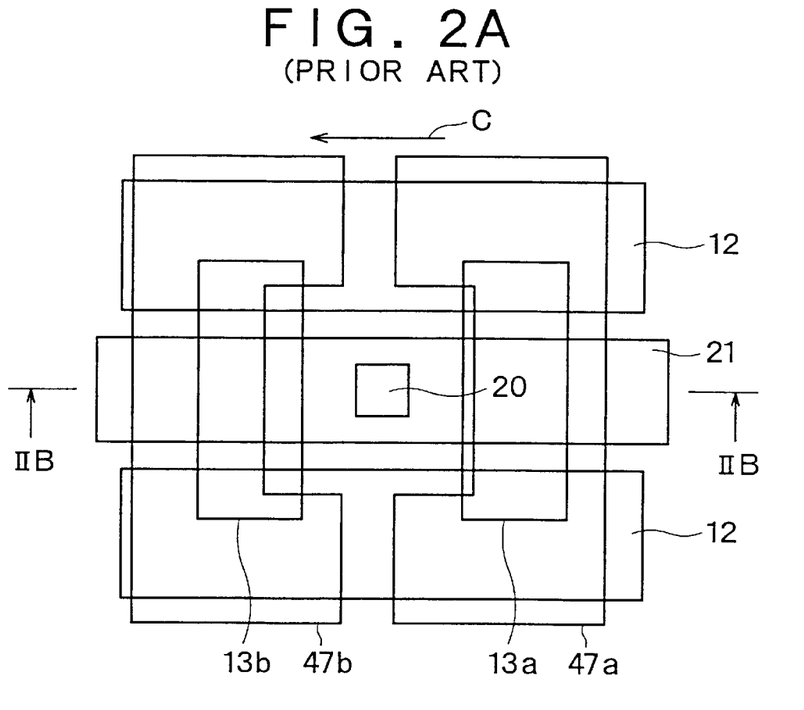
FIG. 2A is a plan view showing a pattern in fabrication of a non-volatile semiconductor memory device of the second prior art.
Figure 2B:
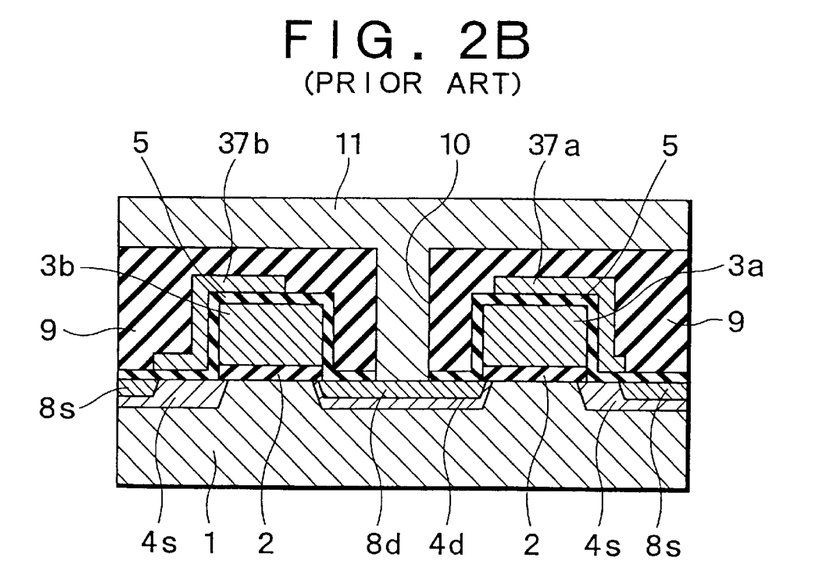
FIG. 2B is a section taken along line IIB—IIB of FIG. 2A.

There has been proposed another non-volatile semiconductor memory device which can solve the problems set forth above. This will be hereinafter referred to as second prior art. FIG. 2A is a plan view showing a pattern in fabrication of the non-volatile semiconductor device of the second prior art, and FIG. 2B is a section taken along line IIB—IIB of FIG. 2A. The second prior art shown in FIGS. 2A and 2B is differentiated from the first prior art shown in FIGS. 1A and 1B only in the configuration of the control gate 17a and 17b. Therefore, like elements to those shown in FIGS. 1A and 1B will be identified by like reference numerals and detailed description for such common elements will be neglected for simplification of disclosure.

In the second prior art, in third masks 47a and 47b for forming control gates 37a and 37b, a cut-out is formed in a part of the pattern. By this, the tip end portions of the control gates 37a and 37b at the side where the contact hole is formed are located on the upper surface of the floating gates 3a and 3b. Accordingly, within a space provided by the cut-out, the contact hole 10 which has greater opening dimension than that in the first prior art can be formed.

In the second prior art constructed as set forth above, since the opening dimension of the contact hole 10 is greater, increasing of contact resistance between the bit line 11 and the second drain region 8d can be avoided. Even with the increased opening dimension, the contact hole 10 may not cause interference with the control gates 37a and 37b. Thus, it becomes unnecessary to make the interval between the floating gates 3a and 3b greater. Accordingly, the memory size can be reduced.

However, in the second prior art shown in FIGS. 2A and 2B, if the third masks 47a and 47b for forming the control gates are misaligned in a direction of as shown by arrow C in FIG. 2A, the tip ends of the control gates 37a and 37b arranged above the upper surfaces of respective floating gates 3a and 3b are offset toward the side of mis-alignment (direction C). Then, the area of the control gate 37a aligned with the floating gate 3a and the area of the control gate 37b aligned with the floating gate 3b are different from each other. As a result, the capacitance value between the floating gate 3a and the control gate 37a and the capacitance value between the floating gate 3b and the control gate 37b becomes different with respect to each other.

In general, in the non-volatile semiconductor memory device of the second prior art, for example upon writing in, when a voltage is applied to the control gates 37a and 37b, potential is induced in the floating gates 3a and 3b. With the potential thus induced in the floating gates 3a and 3b, channels are formed between the source regions 4s, 8s and the drain regions 4d, 8d. Then, among electron flowing between the source and drain, hot electron is injected in the floating gates 3a and 3b.

At this time, amount of hot electron to be injected is significantly variable depending upon the potential in the floating gates 3a and 3b. Therefore, in order to make the writing level (amount of electron in the floating gates) uniform, it becomes necessary to make the potential in the floating gate uniform. The potential of the floating gate significantly depends on the potential in the control gate and on capacity coupling between the floating gate and the control gate. Therefore, if the capacity values between respective memory cells become different, the writing in level of both memory cells become different. As a result, fluctuation of read out speed and erasure speed can be caused resulting in fluctuation of characteristic of the semiconductor memory.

SUMMARY OF THE INVENTION

It is therefore an object of the present invention to provide a non-volatile semiconductor memory device and a fabrication process therefor, which non-volatile semiconductor memory device can reduce contact resistance in a contact region of adjacent gates, permits down-sizing of memory cell and can eliminate fluctuation of characteristics of respective memory cells.

A non-volatile semiconductor memory device with floating gate and control gate, according to the present invention, has a semiconductor substrate, and memory cells formed on the semiconductor substrates. Each of the memory cells includes a tunnel insulation layer selectively formed on the surface of the semiconductor substrate. A floating gate is formed on the surface of the tunnel insulation layer. The floating gate has an upper surface and a pair of side surfaces. An insulation layer is formed on the floating gate. A control gate is formed on the insulation layer only at the portion aligning the upper surface and at least a part of the side surface of the floating gate.

The control gate may be formed on the insulation layer at the portion aligning to the upper surface, one side surface, and the upper portion of the other side surface. Also, a side control gate electrically connected to the control gate may be formed at the portion aligning to the side surfaces of the floating gate. It should be noted that it is not essential to form the side control gate.

The semiconductor memory may include an interlayer insulation layer formed on the surface of the semiconductor substrate and memory cells. The interlayer insulation layer may have a contact hole exposed to the surface of the semiconductor substrate, between adjacent memory cells. Also, a bit line may be formed inside of the contact hole and on the surface of the interlayer insulation layer and connected to the semiconductor substrate via the contact hole.

A fabrication process of a non-volatile semiconductor memory device with floating gate and control gate, according to the present invention, includes a step of forming memory cells formed on a semiconductor substrate. The step of forming each memory cell includes forming a tunnel insulation layer on the surface of the semiconductor substrate. Then, a floating gate is selectively formed on the surface of the tunnel insulation layer. The floating gate has an upper surface and a pair of side surfaces. Then, an insulation layer is formed on the floating gate. Then, a control gate material layer is formed on the insulation layer. Then, a mask is formed on the control gate material layer, the mask having greater size than the floating gate. Next, The control gate material layer is anisotropic etched using the mask. Next, a control gate is formed by removing the portion of the control gate material layer extending in parallel to the substrate from the lower end of the side surface of the floating gate by performing isotropic etching using the mask.

The fabrication process may further comprise the step of forming an interlayer insulation layer on the control gate and the insulation layer after the step of forming control gate. Then, the contact hole exposing the surface of the semiconductor substrate may be provided in the interlayer insulation layer between adjacent memory cells. Then, a bit line may be formed within the contact hole and on the surface of the interlayer insulation layer. The bit line may be connected to the semiconductor substrate via the contact hole.

The fabrication process may further comprise the step of forming a side control gate material layer on the control gate and the surface of the insulation layer after the step of forming control gate. Then, side control gates may be formed at the portion aligning to the side surface of the floating gate by removing a portion of a side control material layer in parallel to the semiconductor substrate by anisotropic etching.

The fabrication process may further comprise the step of forming an interlayer insulation layer on the control gate, the side control gate and the insulation layer after the step of forming the side control gates. Then, a contact hole for exposing the surface of the semiconductor substrate may be provided in the interlayer insulation layer between adjacent memory cells. A bit line may be formed within the contact hole and on the surface of the interlayer insulation layer. The bit line may be connected to the semiconductor substrate via the contact hole.

In the present invention, the control gate is formed only at the portion aligning the upper surface and at least a part of the side surface of the floating gate. The control gate extending in parallel to the substrate from the lower end of the side surface of the floating gate is not present. Therefore, opening dimension of the contact hole formed between the memory cells can be made greater. Accordingly, the contact resistance in the contact region can be reduced. Also, size of the memory cell can be reduced to permit realization of high package density of the device.

On the other hand, when the side control gate is formed at the portion aligning to the side surfaces of the floating gate, the aligning areas of the floating gate and the control gate or the side control gate become large to obtain large capacity.

In the fabrication process of the present invention, the portion of the control gate material layer extending in parallel to the substrate from the lower end of the side surface of said floating gate by performing isotropic etching to form the control gate. Accordingly, the contact resistance in the contact region can be reduced. Also, the size of the memory cell can be reduced to achieve high package density of the device. Also, with reducing the margin of the mask upon fabrication of the control gate, even when misalignment is caused in the position of the mask, the alignment area of the floating gate, and the control gate or side control gate can be uniform in respective memory cells. Accordingly, the capacitance of respective memory cell becomes uniform to make the writing and reading operation speed uniform to prevent occurrence of fluctuation of characteristics.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 3A:
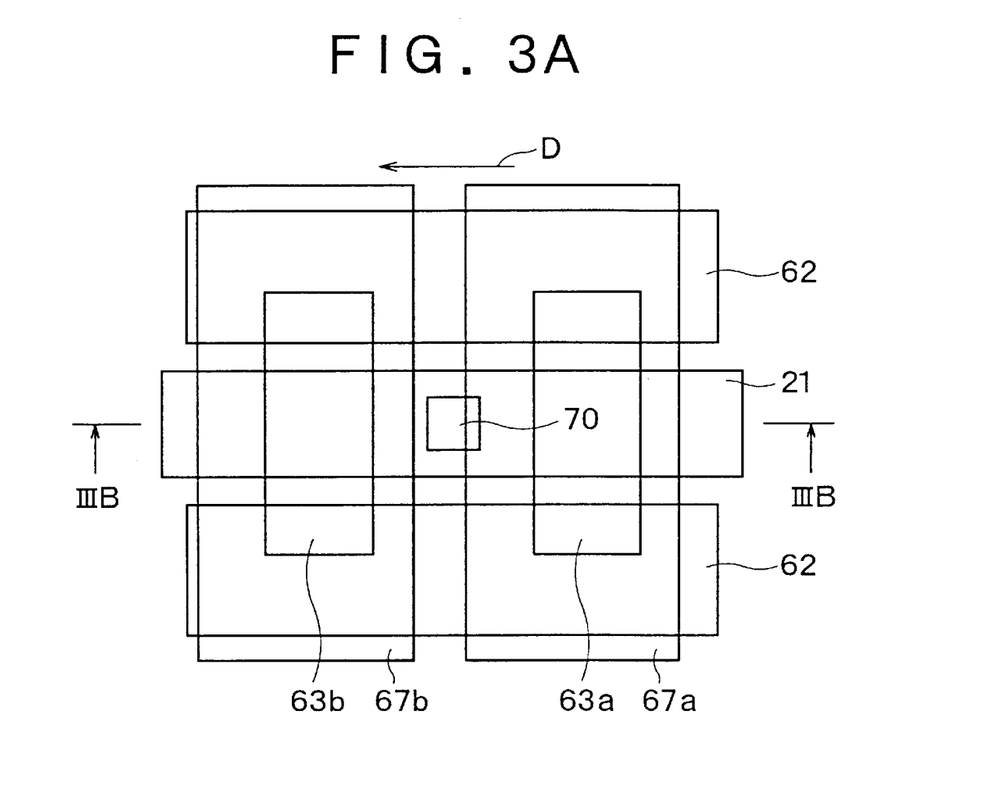
FIG. 3A is a plan view showing a pattern in fabrication of the first embodiment of a non-volatile semiconductor memory device according to the present invention.
Figure 3B:
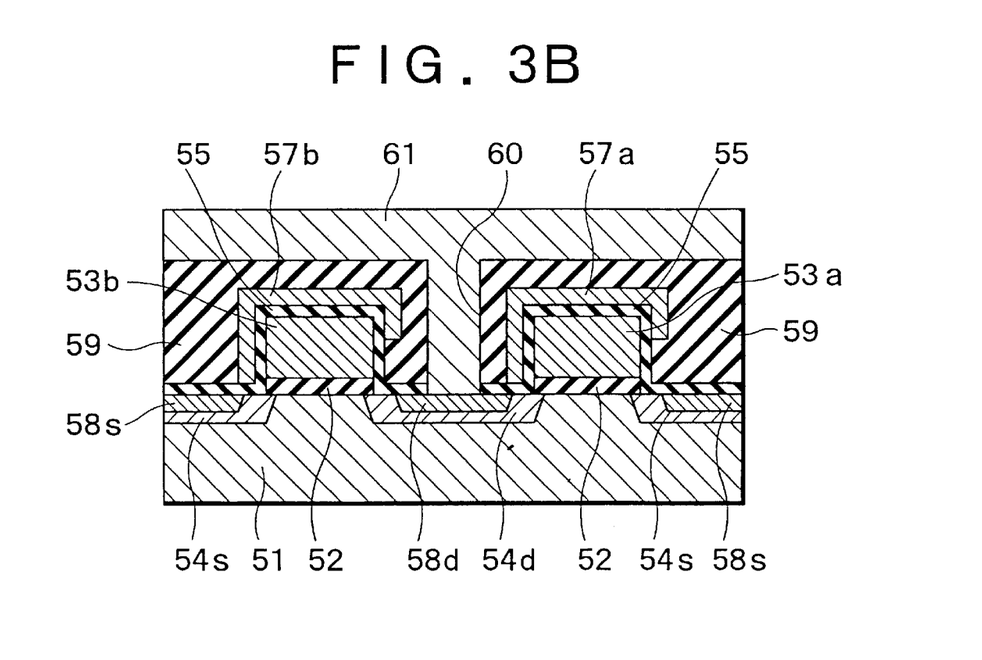
FIG. 3B is a section taken along line IIIB—IIIB of FIG. 3A.

FIG. 3A is a plan view showing a pattern in fabrication of the first embodiment of a non-volatile semiconductor memory device according to the present invention, and FIG. 3B is a section taken along line IIIB—IIIB of FIG. 3A.

A tunnel gate oxide layer 52 is selectively formed on the surface of a silicon substrate 51 in a thickness of 100 Å. Floating gates 53a and 53b of polycrystalline silicon layer in a thickness of 1500 Å are formed on the surface of the gate oxide layer 52. Also, a first drain region 54d and a first source region 54s of n-type lowconcentration diffusion layer are formed at the surface of the silicon substrate 51 in a region extending over the floating gates 53a and 53b. A second drain region 58d and a second source region 58s of n-type high concentration diffusion layer are formed within these first drain region 54d and first source region 54s, respectively.

An oxide layer 55 in a thickness of 200 Å is formed with covering the surfaces of the floating gates 53a and 53b and a part of the surface of the substrate 51. Control gates 57a and 57b of polycrystalline silicon layer in a thickness of 1000 Å are selectively formed on the oxide layer 55. These control gates 57a and 57b are formed at the portion aligning the upper surface, entire portion aligning to one side surface and the upper portion of the other side surface of the floating gates 53a and 53b.

A BPSG layer is formed over the entire surface in a thickness of 5000 Å. A contact hole 60 is provided in the BPSG layer in the region contacting with the second drain region 58d to form an interlayer insulation layer 59. On these surface, bit lines are formed selectively. By this, the bit line 61 is connected to the second drain region 58d via the contact hole 60.

The first embodiment of the non-volatile semiconductor device constructed as set forth above has the control gates 57a and 57b having one tip ends not extending to the region aligning with the surface of the silicon substrate 51. The other tip ends of the control gates 57a and 57b are arranged on the side surfaces of the floating gates 53a and 53b and cover only part of the side surface. Accordingly, in these points, the shown embodiment has different structure to those of the first prior art shown in FIGS. 1A and 1B and the second prior art shown in FIGS. 2A and 2B.

Figure 4A:
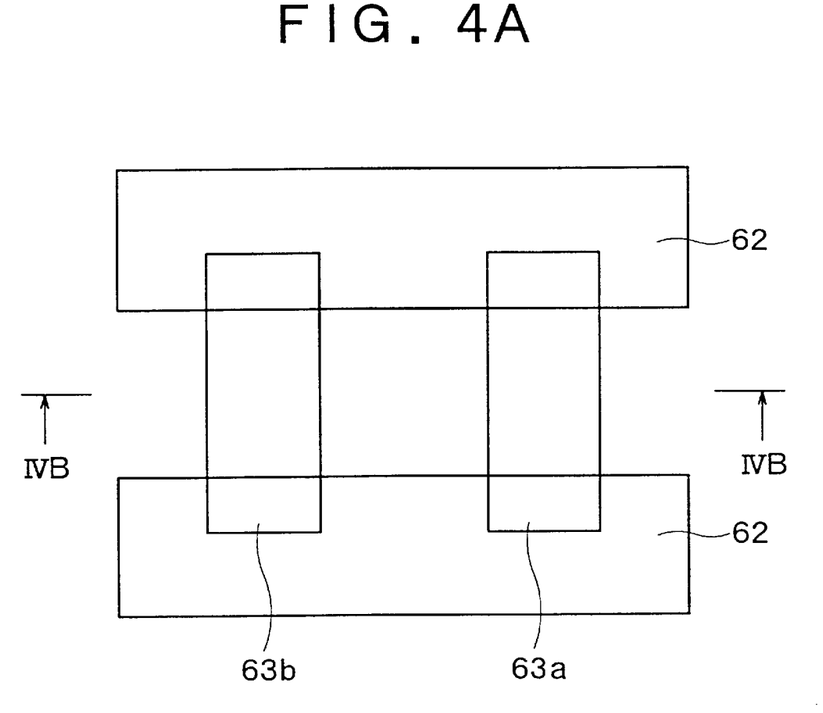
FIG. 4A is a plan view showing a pattern in fabrication of the first embodiment of a non-volatile semiconductor memory device according to the present invention.
Figure 4B:
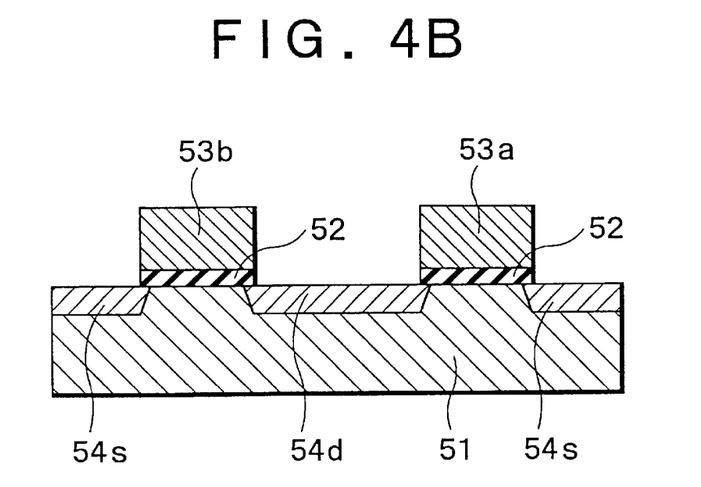
FIG. 4B is a section taken along line IVB—IVB of FIG. 3A.
Figure 5A:
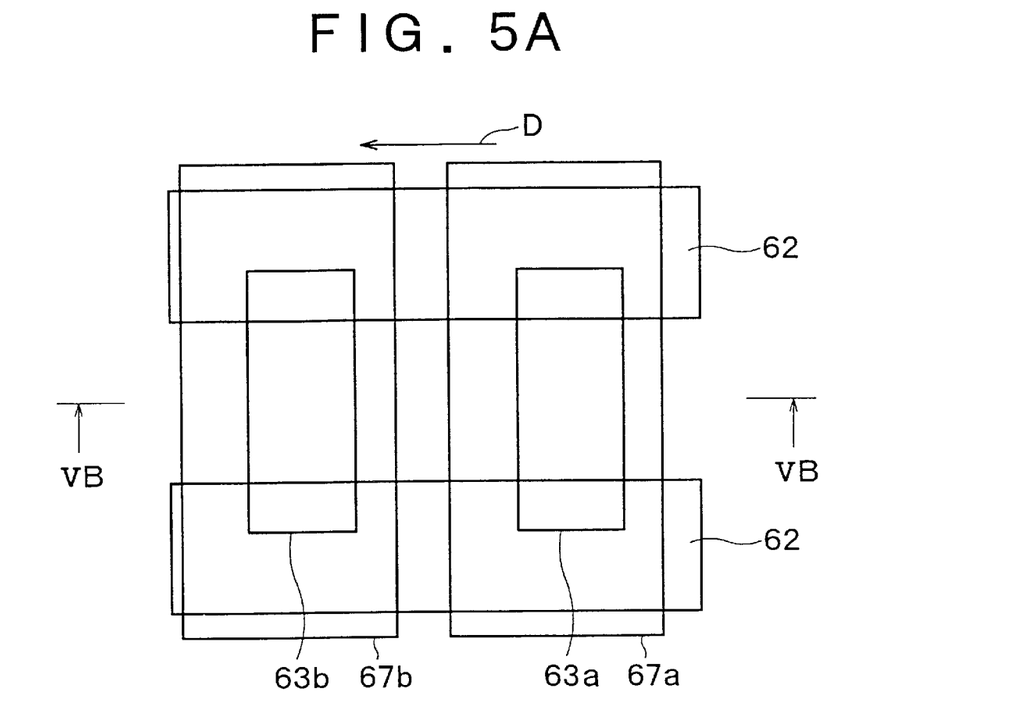
FIG. 5A is plan view showing a pattern in a process step following the step illustrated in FIGS. 4A and 4B.
Figure 5B:
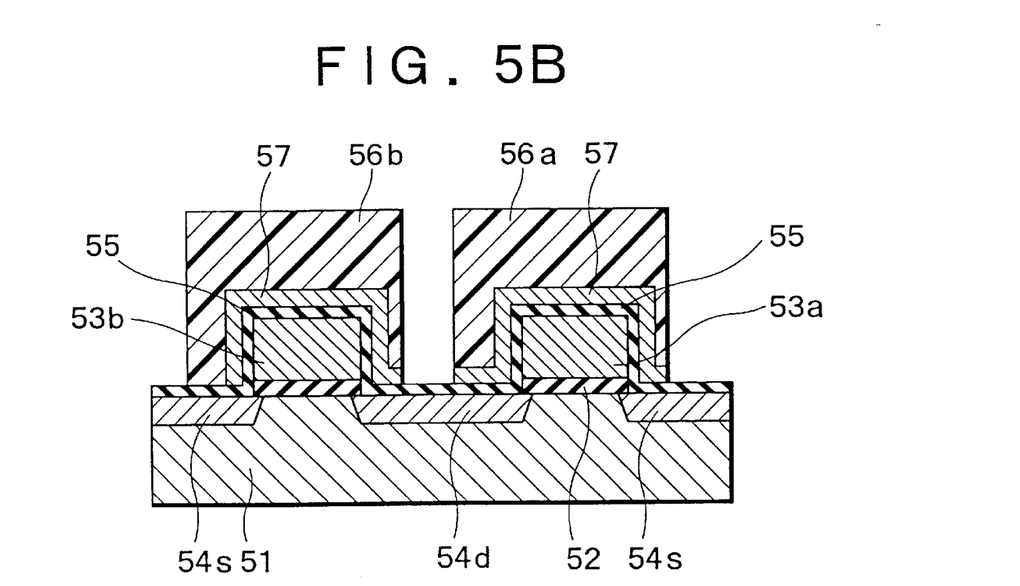
FIG. 5B is a section taken along line VB—VB of FIG. 5A.
Figure 6:
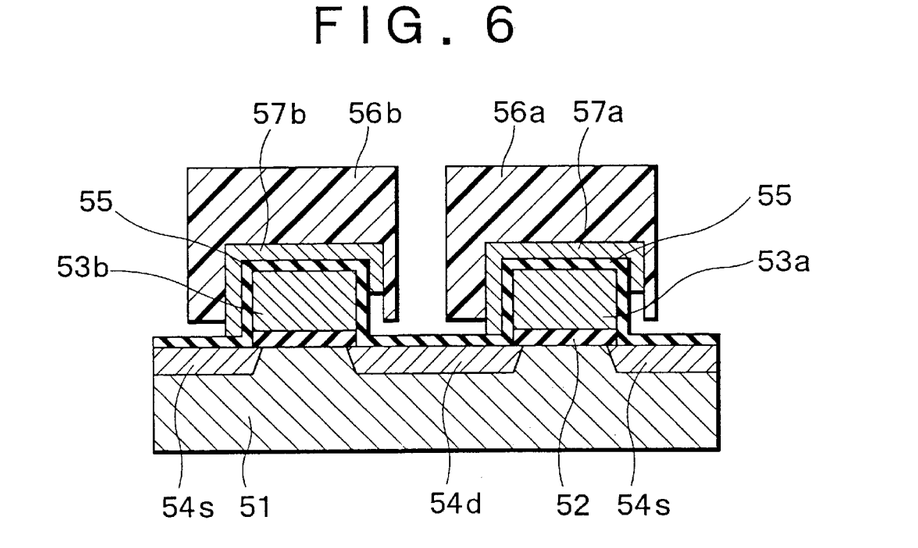
FIG. 6 is a section showing a process step following the step illustrated in FIGS. 5A and 5B.

FIGS. 4A to 6 show fabrication process of the first embodiment of the non-volatile semiconductor memory device in order of sequence of steps. FIGS. 4A and 5A are plan views showing patterns in fabrication, and FIGS. 4B and 5B are sections taken along lines IVB—IVB of FIG. 4A and VB—VB of FIG. 5A. FIG. 6 is a section showing a step next to the process step illustrated in FIGS. 5A and 5B.

As shown in FIGS. 4A and 4B, at first, field patterns 62 are selectively formed on the surface of the silicon substrate 51. With using this field patterns 62, device isolation region (not shown) is defined at the surface of the silicon substrate 51 by way of LOCOS method. Then, a first oxide layer is formed over the entire surface by performing heat treatment of the surface of the silicon substrate 51. A first polycrystalline silicon layer containing impurity is grown over the surface of the first oxide layer in a thickness of 1500 Å.

Next, floating gate patterns 63a and 63b are formed on the first polycrystalline silicon layer. Using these floating gate patterns 63a and 63b, the first polycrystalline silicon layer and the first oxide layer are sequentially etched by way of photolithographic technology to form the floating gates 53a and 53b and the tunnel gate oxide layer 52. Thereafter, phosphorous is introduced in the substrate 51 from the upper side of the silicon substrate 51 by thermal diffusion or ion implantation to form the first drain region 54d and the first source region 54s of low concentration diffusion layer in a region extending over the adjacent gate oxide layer 52.

Thereafter, as shown in FIGS. 5A and 5B, over the entire surface, a second oxide layer 55 in a thickness of 200 Å is formed by way of CVD method. A second polycrystalline silicon layer containing impurity is grown over the second oxide layer 55 in a thickness of 1000 Å. The second oxide layer may be a laminated layer of an oxide layer and a nitride layer. Then, on these surface, the control gate patterns 67a and 67b are formed. Resist masks 56a and 56b are formed by these patterns 67a and 67b. Widths of these resist masks 56a and 56b are formed to be greater than gate width of the floating gates 53a and 53b.

In the shown embodiment, the resist masks 56a and 56b are mis-aligned with respect to the floating gates 53a and 53b in a direction shown by arrow D in FIG. 5A. The mis-alignment depends on performance of a photolithographic device and currently in a magnitude of about 0.1 to 0.2 μm.

Thereafter, using the resist masks 56a and 56b, the second polycrystalline silicon layer is subject to anisotropic etching to form a preliminary control gate 57. Then, as shown in FIG. 6, again using the resist masks 56a and 56b, isotropic etching of the preliminary control gate 57 is performed. The preliminary control gate 57 is etched from the tip end portion not covered with the resist masks 56a and 56b. Namely, with respect to the preliminary control gate 57, side etching is performed. The side etching is continued up to the position where the tip end portion is positioned aligning to the side surface of the floating gates 53a and 53b. In the shown embodiment, at the misalignment side (D side) of the resist masks 56a and 56b, etching is continued until the preliminary control gate 57 is etched completely up to the portion aligned with the surface of the silicon substrate 51. Accordingly, in the preliminary control gate 57 at the opposite side to the misalignment side, a part of the side surface of the floating gates 53a and 53b are etched.

Thereafter, the resist masks 56a and 56b are removed. As shown in FIG. 6, from the upper side of the silicon substrate 51, arsenic is doped in the surface of the substrate 51 by ion implantation to form the second drain region 58d and the second source region 58s of high concentration diffusion layer are formed. Also, over the entire surface, the BPSG layer is grown in the thickness of 5000 Å. A contact pattern 70 is formed on the BPSG layer.

Using the contact pattern 70, at the second oxide layer 55 contacting with the second drain region 58d and the BPSG layer formed thereover, the contact hole 60 is formed to form the interlayer insulation layer 59. Subsequently, an aluminum layer is formed over the entire surface by sputtering, and a bit line pattern 71 is formed on the surface thereof. Then, with using the pattern 71, the aluminum layer is etched to form the bit line 61.

Thus, in the first embodiment of the non-volatile semiconductor memory device according to the present invention, widths of forming of the control gates 57a and 57b is required to be certainly provide widths of the floating gates 53a and 53b and thickness of control gates at both side surfaces. A margin during fabrication of the mask (control gate patterns 67a and 67b) of the control gates 57a and 57b, becomes equal to the thickness of the control gates 57a and 57b. Namely, assuming that the thickness of the control gates 57a and 57b is 0.1 μm, one side margin can be 0.1 μm, and over-margin becomes unnecessary. As a result,the interval between the floating gate 53a and the control gate 57a and between the floating gate 53b and the control gate 57b, namely the interval between adjacent memory cell transistors can be reduced to achieve higher package density by down-sizing of the memory cell.

The control gates 57a and 57b are removed the portion (tip end portion) extending in parallel to the silicon substrate 51 from the side surface portions of the floating gates 53a and 53b, by side etching. Therefore, in the region aligned with the surfaces of the substrate 51 between adjacent memory cells, the control gate is not present. Accordingly, even when the distance between the memory cells is small, the opening dimension of the contact hole 60 can be made greater. Also contact resistance between the bit line 61 and the second drain region 58d can be reduced.

Also, even when the masks 67a and 67b of the control gates are mis-aligned, offset amounts of the control gates 57a and 57b with respect to the floating gates 53a and 53b of respective memory cells become equal to each other. Then, since the control gates 57a and 57b are removed the portion extending in parallel to the substrate from the lower end of the surface of the floating gate, a part of the control gates 57a and 57b formed on one side surface of the floating gates 53a and 53b maybe removed by etching. Even in such case, alignment areas of the control gates 57a, 57b and the floating gates 53a, 53b in respective memory cells become equal to each other. Thus, the capacity values of respective memory cells become equal to each other. Therefore, fluctuation of read out speed and erasure speed can be presented to make the characteristics of the overall semiconductor memory uniform.

When a precision of positioning of the resist masks 56a and 56b for forming the control gates 57a and 57b is ±0.2 μm, a maximum deviation, namely within a range of 0.2 μm+|−0.2 μm|=0.4 μm, the side etching of the control gate may be performed. On the other hand, when mis-alignment is not caused, the positions of the resist masks 56a and 56b shown in FIG. 5 become symmetric with respect to the floating gates 53a, 53b to make the lengths of the control gates 57a and 57b at both sides of the floating gates 53a and 53b uniform. Accordingly, the control gates 53a and 53b are formed uniformly at the portion aligning entirely or partly to the side surface of the floating gates 53a and 53b.

Figure 7:
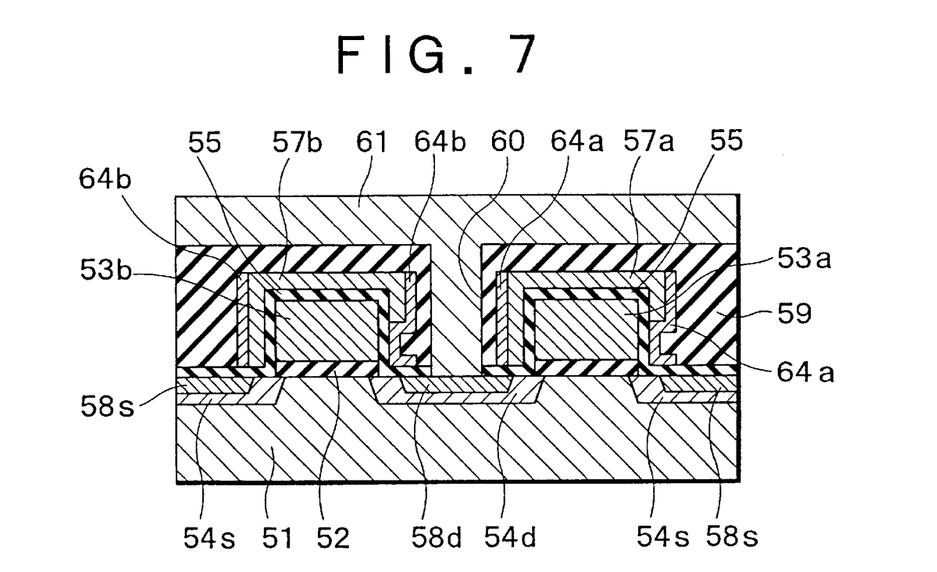
FIG. 7 is a section showing the second embodiment a non-volatile semiconductor memory device according to the present invention.

FIG. 7 is a section of the second embodiment of the non-volatile semiconductor memory according to the present invention. In the second embodiment shown in FIG. 7, like elements to those in the first embodiment shown in FIGS. 3A and 3B will be identified by like reference numerals for keeping the disclosure simple enough to facilitate clear understanding of the present invention.

In the second embodiment, in both side surfaces of the floating gates 53a and 53b of the first embodiment, the side control gates 64a and 64b are formed at the portion aligning to the side surfaces of the floating gate. The side control gates 64a and 64b has respectively equal thickness to those of the thickness of the floating gates 53a and 53b.

Figure 8:
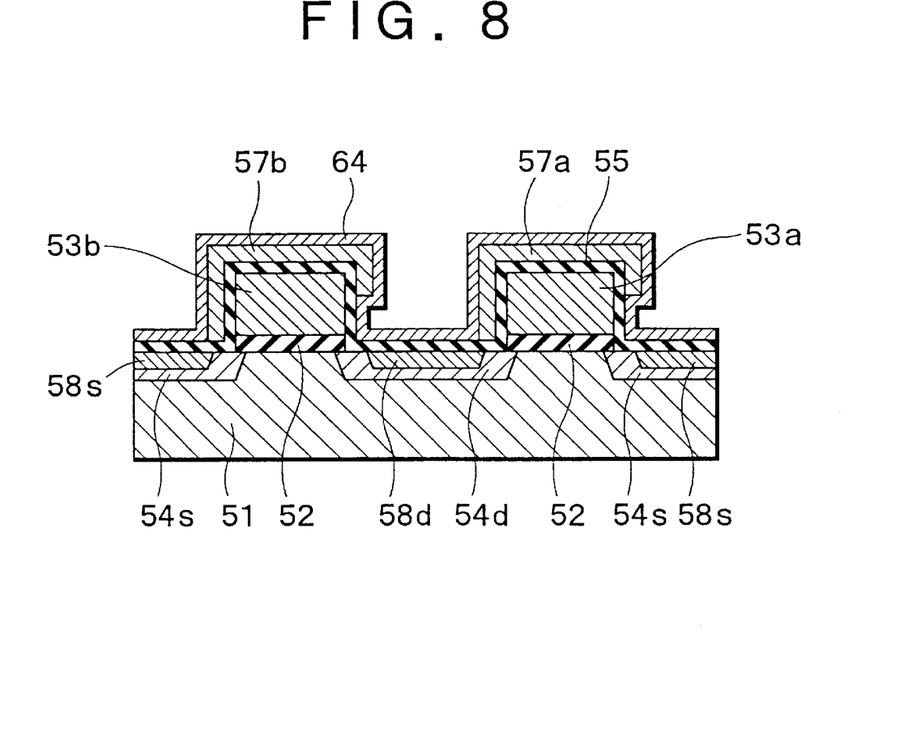
FIG. 8 is a section showing a process step in fabrication of the second embodiment of the non-volatile semiconductor memory device according to the present invention.
Figure 9:
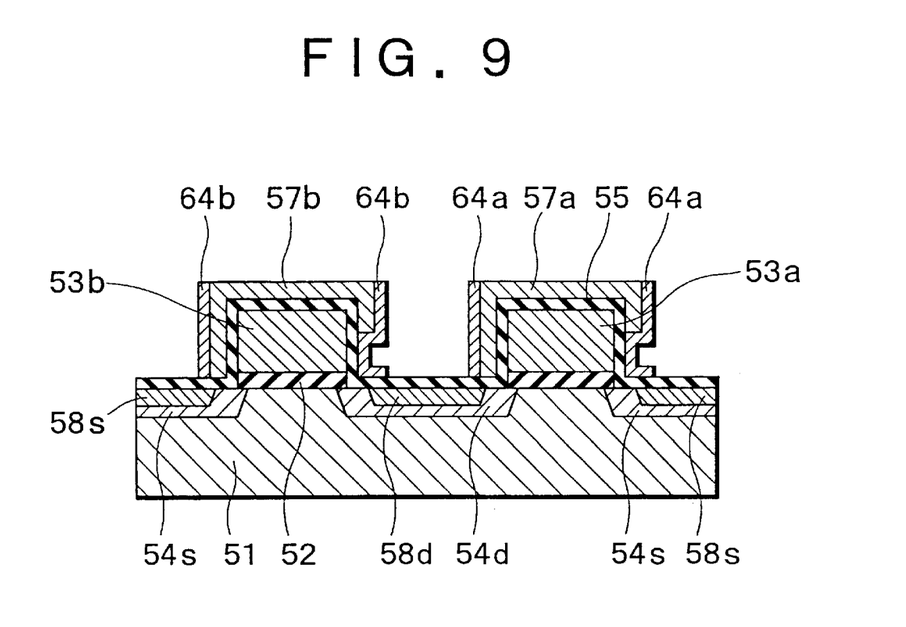
FIG. 9 is a section showing a process step next to the process step illustrated in FIG. 8.

FIGS. 8 and 9 are sections showing fabrication of the second embodiment of the non-volatile semiconductor memory device shown in FIG. 7, in order of sequential process. At first, through the processes shown in FIGS. 4A to 6, the control gates 57a and 57b are formed. Then, as shown in FIG. 8, the resist masks 56a and 56b are removed. From the upper side of the silicon substrate 51, arsenic is doped on the surface of the surface of the substrate 51 by ion implantation to form the second drain region 58d and the second source region 58s of the high concentration diffusion layer. Next, over the entire surface, the polycrystalline silicon layer 64 containing impurity is grown in the thickness of 500 Å. By this, at the portion aligning to the side surface of the floating gates 53a and 53b, the polycrystalline silicon layer 64 is grown even in a region not covered with the control gates 57a and 57b. The polycrystalline silicon layer 64 is electrically connected to the control gates 57a and 57b.

Subsequently, as shown in FIG. 9, anisotropic etching of the polycrystalline silicon layer 64 is performed for the layer thickness (500 Å). The portion of the polycrystalline silicon layer 62 in parallel to the semiconductor substrate is removed by etching. By this, the polycrystalline silicon 64 are remained only in the portion aligning to the side surfaces of the floating gates 53a and 53b, and the side control gates 64a and 64b are formed. Subsequently, similarly to the first embodiment of the non-volatile semiconductor memory device, by forming the interlayer insulation layer 59, the contact hole 60 and the bit line 61, the second embodiment of the non-volatile semiconductor memory device as shown in FIG. 7, can be fabricated.

In the second embodiment of the non-volatile semiconductor memory constructed as set forth above, the control gates constructed with the side control gates 64a and 64b and the control gates 57a and 57b presents in all portion aligning to the side surface and the upper surface of the floating gates 53a and 53b. Accordingly, in all of the memory cells, since the overall surfaces of the floating gates 53a and 53b are covered with the control gates 57a and 57b or the side control gates 64a and 64b, capacitance using overall surface can be obtained.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A non-volatile semiconductor memory device with floating gate and control gate comprising:
   a semiconductor substrate;
   memory cells formed on said semiconductor substrates, each of said memory cells including,
      a tunnel insulation layer selectively formed on the surface of said semiconductor substrate;
      a floating gate formed on the surface of said tunnel insulation layer, said floating gate having an upper surface and a pair of side surfaces;
      an insulation layer formed on said floating gate;
      a control gate formed on said insulation layer only at the portion aligning said upper surface and at least a part of said side surfaces of said floating gate exposing a portion of said insulating layer formed on the side surfaces of said floating gate; and
   a side control gate electrically connected to the control gate and formed on the sides of the control gate and on said exposed portion of said insulating layer aligned the side surfaces of said floating gate.

2. A non-volatile semiconductor memory device as set forth in claim 1, wherein said control gate is formed on said insulation layer at the portion aligning to said upper surface, one side surface, and the upper portion of the other side surface.

3. A non-volatile semiconductor memory device as set forth in claim 1, which further comprises:
   an interlayer insulation layer formed on the surface of said semiconductor substrate and memory cells, said interlayer insulation layer having a contact hole exposed to the surface of said semiconductor substrate, between adjacent memory cells, and
   a bit line formed inside of said contact hole and on the surface of said interlayer insulation layer and connected to said semiconductor substrate via said contact hole.

4. A non-volatile semiconductor memory device as set forth in claim 1, wherein said floating gate and said control gate are formed with a polycrystalline silicon.

5. A non-volatile semiconductor memory device as set forth in claim 1, wherein said tunnel oxide layer is an oxide layer.

6. A non-volatile semiconductor memory device as set forth in claim 1, wherein said insulation layer is an oxide layer.

7. A non-volatile semiconductor memory device as set forth in claim 1, wherein said insulation layer is a laminated layer of an oxide layer and a nitride layer.

8. A non-volatile semiconductor memory device as set forth in claim 1, wherein said control gate is formed of polycrystalline silicon.

9. A non-volatile semiconductor memory device as set forth in claim 3, wherein said interlayer insulation layer is a BPSG layer.

10. A non-volatile semiconductor memory device as set forth in claim 3, wherein said bit line is formed of with aluminum layer.

* * * * *